United States Patent [19]
Sim et al.

[11] Patent Number: 5,777,945
[45] Date of Patent: Jul. 7, 1998

[54] COLUMN DECODING CIRCUIT FOR SEMICONDUCTOR MEMORY DEVICE

[75] Inventors: Jae-Kwang Sim; Sang-Ho Lee, both of Choongchungbook-Do, Rep. of Korea

[73] Assignee: LG Semicon Co., Ltd., Cheongju, Rep. of Korea

[21] Appl. No.: 886,445

[22] Filed: Jul. 1, 1997

[30] Foreign Application Priority Data

Jul. 1, 1996 [KR] Rep. of Korea ............... 26623/1996

[51] Int. Cl.$^6$ ................................................. G11C 8/00
[52] U.S. Cl. ................................ 365/230.06; 365/233.5
[58] Field of Search .......................... 365/230.06, 233, 365/233.5

[56] References Cited

U.S. PATENT DOCUMENTS

| | | | |
|---|---|---|---|
| 4,947,379 | 8/1990 | Okuyama | 365/233.5 |
| 4,972,373 | 11/1990 | Kim et al. | 365/233.5 |
| 5,313,434 | 5/1994 | Abe | 365/233.5 |
| 5,526,322 | 6/1996 | Lee | 365/233.5 |
| 5,566,129 | 10/1996 | Nakashima et al. | 365/233.5 |
| 5,640,363 | 6/1997 | Furutani et al. | 365/233.5 |

*Primary Examiner*—Son T. Dinh
*Attorney, Agent, or Firm*—Fleshner & Kim

[57] ABSTRACT

A column decoding circuit for a semiconductor memory device includes a decoding unit and a pulse generating unit. The decoding unit decodes a selected column address and generates a selection signal. The pulse generating unit self-generates a pulse signal based on the selection signal output from the decoding unit. The pulse generating unit uses the self-generated pulse signal and the selection signal to output to a selected column switch a control signal having a minimum pulse width sufficient for selecting an associated column. Accordingly, a high speed read operation is performed by decreasing a loading and transmission time of the control signal. Further, power consumption of the column decoding circuit is decreased by self-generating the pulse signal, preferably based on the selection signal.

18 Claims, 5 Drawing Sheets

FIG. 1
BACKGROUND ART
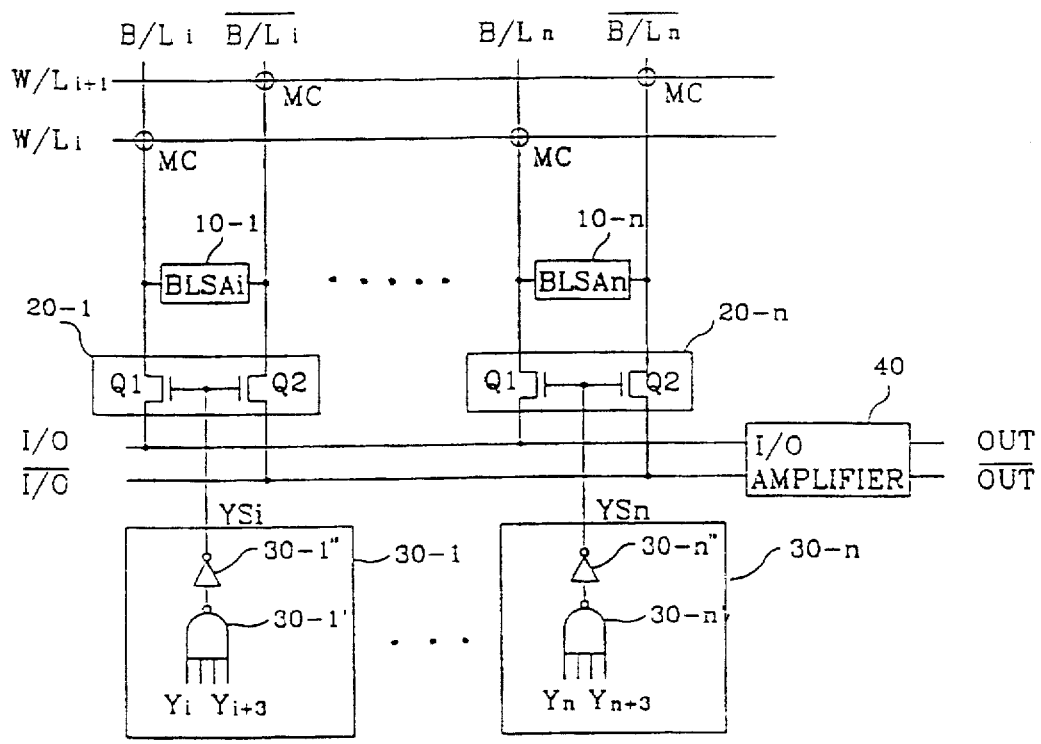
FIG. 2A
BACKGROUND ART
FIG. 2B
BACKGROUND ART
FIG. 2C
BACKGROUND ART
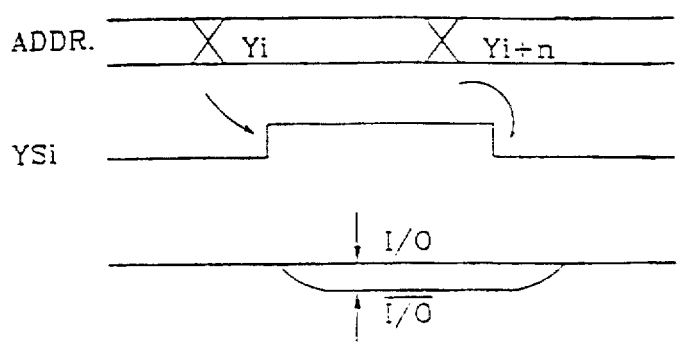

BACKGROUND ART ADDR.

BACKGROUND ART ATD

BACKGROUND ART YSG

BACKGROUND ART I/O $\overline{I/O}$

FIG. 8A ADDR.

FIG. 8B PSi

FIG. 10A   ADDR.

FIG. 10B   $Y_i$

FIG. 10C   NODE A

FIG. 10D   NODE B

FIG. 10E   $PS_i$

COLUMN DECODING CIRCUIT FOR SEMICONDUCTOR MEMORY DEVICE

BACKGROUND OF THE INVENTION

1. Field of the Invention

The present invention relates to a column decoding circuit for a semiconductor memory device, and more particularly, to a column decoding circuit for a semiconductor memory device that decreases the loading and the transfer time of a pulse signal.

2. Background of the Related Art

As shown in FIG. 1, a related art column decoding circuit using a static column decoding method includes a plurality of bit line sense amplifiers 10-1, . . . . , 10-n, a plurality of column switches 20-1, . . . . 20-n, a plurality of static column decoders 30-1, . . . . 30-n and an input/output (I/O) amplifier 40. The plurality of bit line sense amplifiers (BLSAi, . . . . BLSAn) 10-1, . . . . , 10-n is respectively coupled to a plurality of sets of bit lines (B/Li, /B/Li), . . . . , (B/Ln, /B/Ln) to amplify data read from respective memory cells MC. The plurality of column switches 20-1, . . . .20-n outputs data received from the corresponding bit line sense amplifiers (BLSAi, . . . .BLSAn) 10-1, . . . . .10-n to respective input/output lines I/O, /I/O, in accordance with respective selection signals YSi, . . . .YSn. The plurality of static column decoders 30-1, . . . .30-n receives one of a plurality of sets of column address signals (Yi, . . . .Yi+3), . . . .(Yn,. . . .Yn+3) and outputs the respective selection signals YSi, . . . .YSn to the corresponding column switches 20-1, . . . .20-n. Finally, the input/output (I/O) amplifier 40 amplifies the respective data signals output from the column switches 20-1, . . . .20-n via the input/output lines I/O, /I/O.

The static column decoders 30-1, . . . .30-n respectively include NAND gates 30-1', . . . .30-n' for NANDing the respective column address signals (Yi,. . . .Yi+3), . . . . (Yn,. . . .Yn+3), and inverters 30-1", . . . .30-n" for inverting output values of the NAND gates 30-1', . . . .30-n'. The inverters 30-1", . . . .30-n" output the respective selection signals YSi, . . . .YSn.

The operation of the static column decoding method related art column decoding circuit will now be described.

First, an example using bit line sense amplifier (BLSAi) 10-1, column switch 20-1, and static column decoder 30-1 will be described. When a specific word line W/Li is selected among a plurality of word lines W/Li, W/Li+1, . . . in accordance with a row decoder (not shown), a data signal is read from a memory cell MC located on word line W/Li and loaded on corresponding bit line set B/Li, /B/Li. Then, the data signals loaded on the bit line set B/Li, /B/Li are amplified to a predetermined level in bit line sense amplifier (BLSAi) 10-1 and applied to column switch 20-1.

As shown in FIG. 2A, when column address signals Yi, . . . .Yi +3 are applied to the static column decoder 30-1 and selection signal YSi is turned to a "high" level as shown in FIG. 2B, transistors Q1, Q2 in the column switch 20-1 are turned on in accordance with the selection signal YSi. Thus, the data signals amplified in bit line sense amplifier (BLSAi) 10-1 become loaded on the input/output line set (I/O, /I/O) as shown in FIG. 2C.

As shown in FIG. 2B, the selection signal YSi output from the static column decoder 30-1 maintains a "high" level until a transition in column address signals Yi, . . . .Yi+3. Thus, the selection signal YSi is turned to a "low" level at the transition of the column address signals Yi, . . . .Yi +3, according to the static column decoding method. Next, the data loaded on the input/output line set I/O, /I/O are amplified in the I/O amplifier 40 and output to complete a data read operation.

However, the static column decoding method shown in FIG. 2C incurs considerable time in precharging the input/output line set I/O, /I/O for a next read cycle because of a full swing that causes a larger logic swing width. Thus, read speed of the related art static column decoding method is reduced.

FIGS. 3–4 illustrate another related art static column decoding circuit including an I/O line set fixed to a predetermined level. The static column decoding circuit includes a clamp transistor 50 coupled to input/output line set I/O, /I/O to decrease a precharge time for the input/output line set I/O, /I/O. As discussed above, the precharge time reduces the read speed in the static column decoding method.

As shown in FIG. 4C, a logic swing width of the input/output line set I/O, /I/O is confined to a certain level using the clamp transistor 50. Thus, the clamp transistor 50 decreases precharging time of the input/output line set I/O, /I/O relative to the circuit of FIG. 1 to improve the data read speed.

Although the static column decoding circuit using the clamp transistor 50 improves the data read speed, a static current flowing through the clamp transistor 50 increases power consumption.

FIGS. 5–6D illustrate yet another related art pulse signal input column decoding circuit where the structure of the plurality of bit line sense amplifiers (BLSAi, . . . .BLSAn) 10-1, . . . .10-n, the plurality of column switches 20-1, . . . .20-n, and the I/O amplifier 40 are identical to the related circuits shown in FIGS. 1 and 3. The circuit additionally includes a pulse generator 60 and a plurality of pulse input column decoders 70-1, . . . . , 70-n, as shown in FIG. 5. The pulse generator 60 generates a pulse signal YSG having a certain width in accordance with an address transition detecting (ATD) signal for a column address signal. The plurality of pulse input column decoders 70-1, . . . .70-n receives the pulse signal YSG and column address signals (Yi, . . . .Yi+3), . . . .(Yn, . . . .Yn+3) and outputs the respective selection signals YSi, . . . .YSn to the column switches 20-1, . . . .20-n.

As shown in FIG. 5, the pulse input column decoders 70-1, . . . .70-n are identical in construction. Thus, only pulse input column decoder 70-1 is described in detail. The pulse input column decoder 70-1 includes a NAND gate 71-1 for NANDing column address signals Yi, . . . .Yi+3, an inverter 72-1 for inverting an output signal of the NAND gate 71-1, a NAND gate 73-1 for NANDing an output signal of inverter 72-1 and the pulse signal YSG, and an inverter 74-1 for inverting an output signal of the NAND gate 73-1 to output selection signal YSi. The operation of this related art pulse signal input column decoding circuit will now be described with reference to FIGS. 6A–6D.

First, as described above, the data signal read from the memory cell MC is amplified in the bit line sense amplifier (BLSA) 10-1 through the corresponding bit line set B/Li, /B/Li and applied to the column switch 20-1.

As shown in FIG. 6A, column address signals Yi, . . . .Yi +3 are applied through the NAND gate 71-1 and the inverter 72-1 to an input terminal of the NAND gate 73-1. As shown in FIG. 6C the pulse generator 60 outputs the pulse signal YSG to another input terminal of the NAND gate 73-1 in accordance with the ATD signal of the column address signals Yi, . . . .Yi+3 shown in FIG. 6B.

Thus, the NAND gate 73-1 NANDs the inverter 72-1 output and the pulse signal YSG to generate a high level selection signal YSi from the inverter 74-1 to the column switch 20-1. The high level selection signal YSi turns on the transistors Q1, Q2. The data read from the memory cell MC is loaded on the input/output line set I/O, /I/O during a high level interval of the selection signal YSi.

Therefore, as shown in FIG. 6D, a precharge time for the input/output lines I/O, /I/O is decreased to improve data access speed.

Construction of the pulse input column decoders 70-1, . . . ,70-n are identical. However, in this related art pulse input column decoding method, the pulse signal YSG operates all the pulse input column decoders 70-1, . . . ,70-n through one transmission line. As shown in FIG. 5, point A adjacent to pulse generator 60 does not experience significant delay. However, point B distanced from the pulse generator 60 receives significantly increased rise time and significantly increased fall time for the pulse signal YSG because of resistance and capacitive loading of the transmission line during transmission of the pulse signal YSG.

Further, a valid pulse width of the pulse signal YSG received at the point B is narrowed or the amplitude of the pulse signal YSG is decreased, which makes it difficult to obtain sufficient signals for reading data. Thus, an operation time of the input/output line set I/O,/I/O of the related art circuit shown in FIG. 5 is decreased.

The above references are incorporated by reference herein where appropriate for appropriate teachings of additional or alternative details, features and/or technical background.

SUMMARY OF THE INVENTION

An object of the present invention is to substantially obviate one or more of the problems caused by limitations and disadvantages of the related art.

It is another object of the present invention to provide a column decoding circuit for a semiconductor memory device that generates a pulse signal to select a column from respective column decoders and uses a pulse generator that maintains a substantially identical pulse width and logic swing width regardless of column location.

It is yet another object of the present invention to provide a column decoding circuit for a semiconductor memory device that performs a high speed read operation by decreasing a loading and transmission time of the pulse signal.

It is still yet another object of the present invention to provide a column decoding circuit for a semiconductor memory device that provides a pulse generating unit proximate to each of a plurality of respective column decoders that self-generates a pulse signal based on a selection signal.

To achieve the above-described objects, there is provided a column decoding circuit and method for a semiconductor memory device that includes a plurality of memory cells arranged in a plurality of columns and rows, a plurality of bit line sense amplifiers and column switches, a decoding unit and a pulse generating unit. The data in a row of memory cells is read based on a selected row address signal. Further, the plurality of bit line sense amplifiers and a column switches are coupled to respective ones of the plurality of columns. Thus, the column switches receive the data read from the row of memory cells via the bit line sense amplifiers. The decoding unit decodes a selected column address and generates a selection signal to select one of the column switches and the pulse generating unit proximate to the decoding unit generates a pulse signal based on the selection signal and outputs the pulse signal to the selected column switch a signal having a minimum pulse width needed for selecting a column.

The present invention may be achieved in whole or in part by a column decoding circuit having a decoding unit for decoding a selected column address and generating a selection signal that selects one of the column switches, and a pulse generating unit proximate to the decoding unit that generates a pulse signal based on the selection signal and outputs the pulse signal to the selected column switch.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein:

FIG. 1 is a schematic diagram showing a related art static column decoding circuit;

FIGS. 2A–2C are diagrams showing timing of the circuit of FIG. 1;

FIGS. 8A–8C are diagrams showing timing of the circuit of FIG. 7;

FIGS. 10A–10E are diagrams showing timing of the circuit of FIG. 9.

DETAILED DESCRIPTION OF PREFERRED EMBODIMENTS

Figure 3:
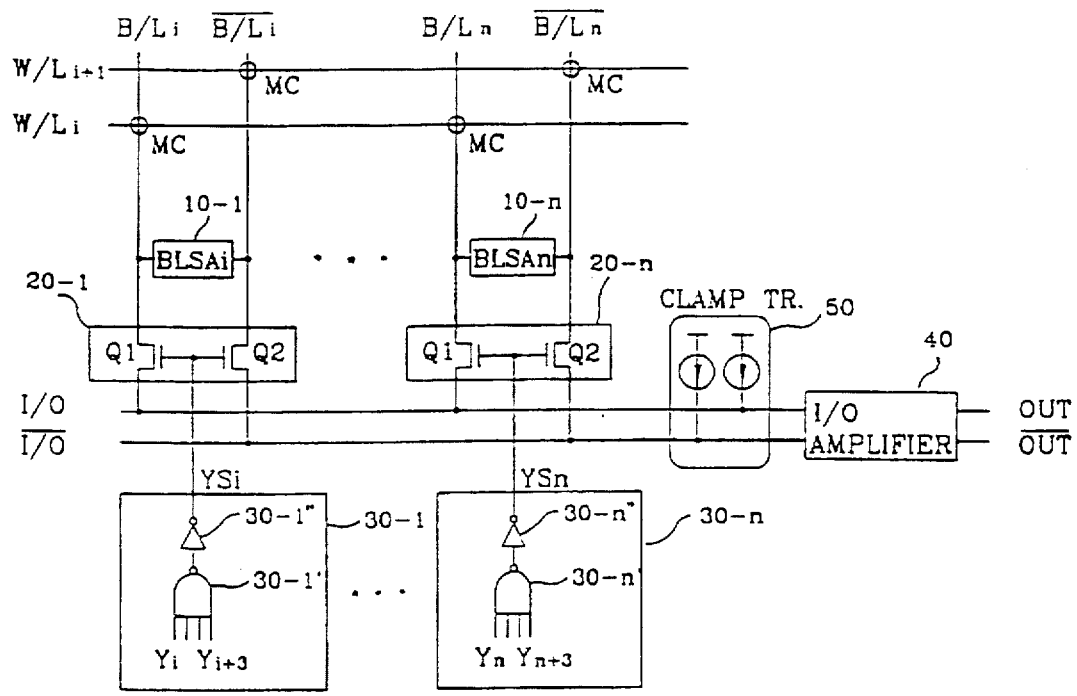
FIG. 3 is a schematic diagram showing a related art static column decoding circuit having an I/O signal line fixed to a predetermined level.
Figure 4A:
FIGS. 4A–4C are diagrams showing timing of the circuit of FIG. 3.
Figure 4B:
Figure 4C:
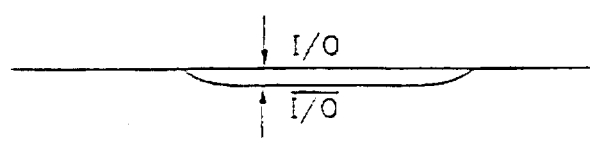
Figures 5, 6A, 6B, 6C, 6D:
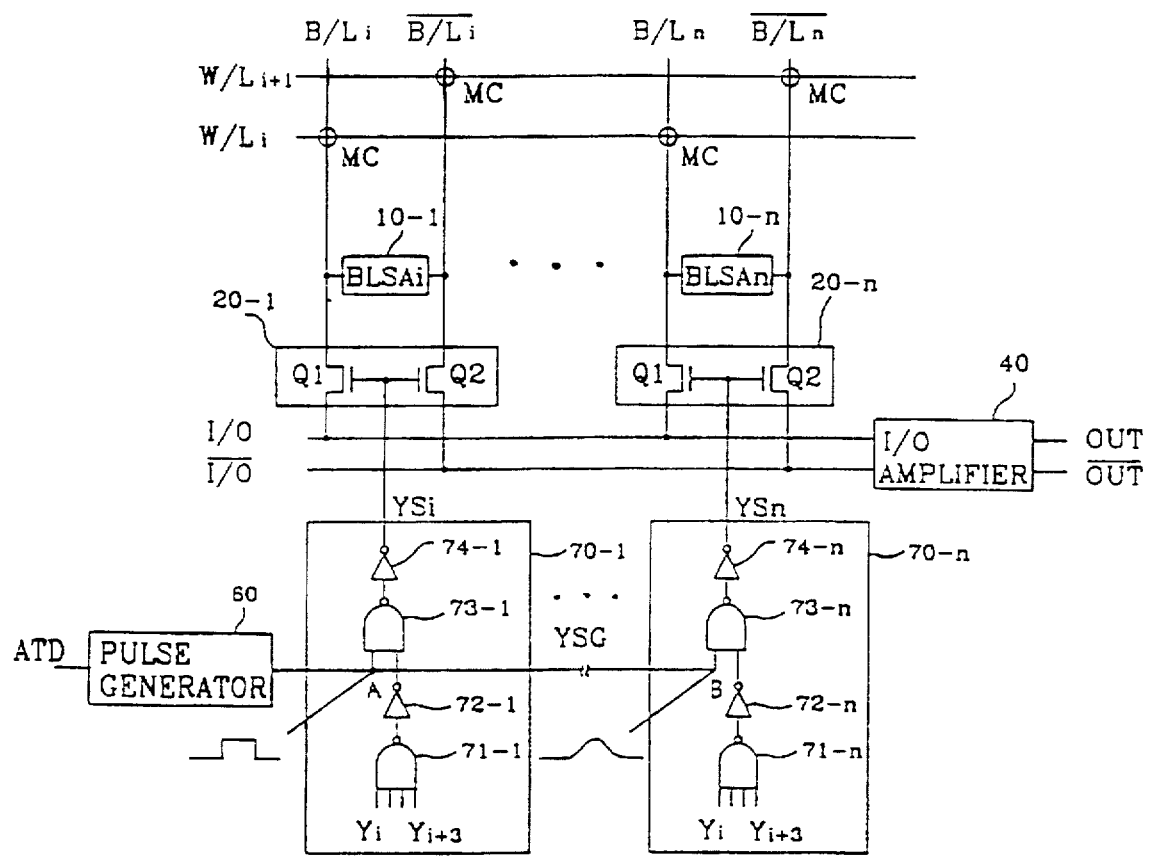
FIG. 5 is a schematic diagram showing a related art pulse input column decoding circuit.
FIGS. 6A–6D are diagrams showing timing of the circuit of FIG. 5.
Figure 7:
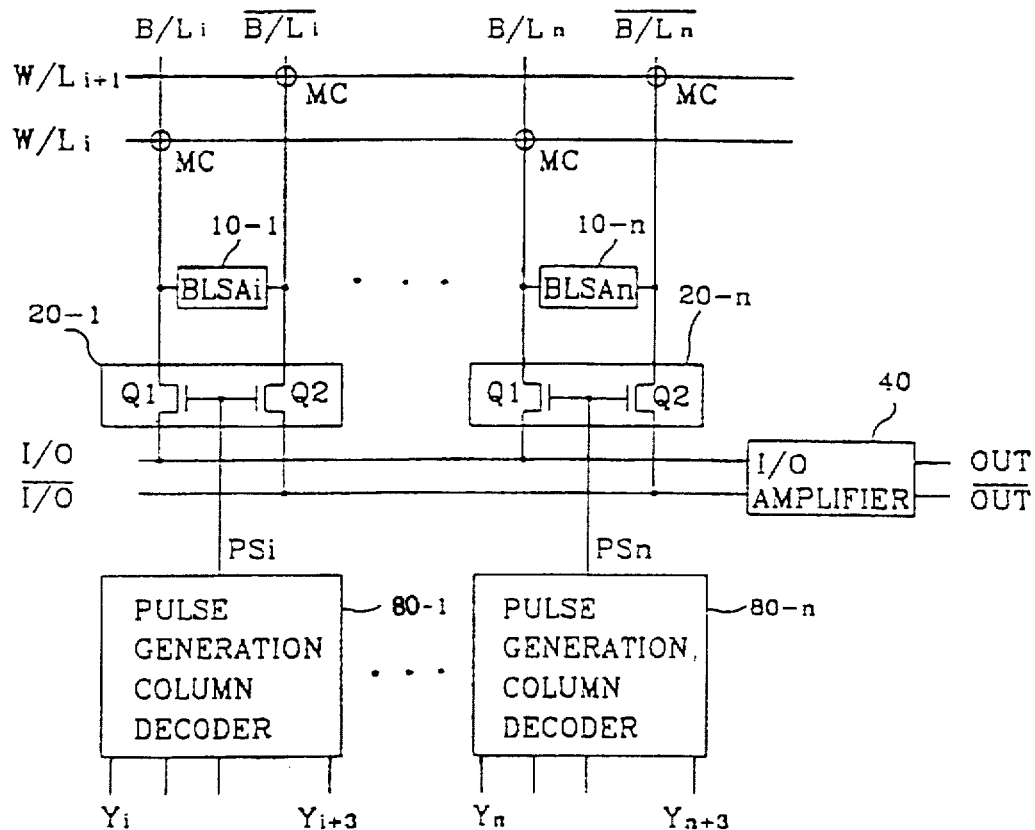
FIG. 7 is a schematic diagram showing a preferred embodiment of a column decoding circuit for a semiconductor memory device according to the present invention.
Figure 7:
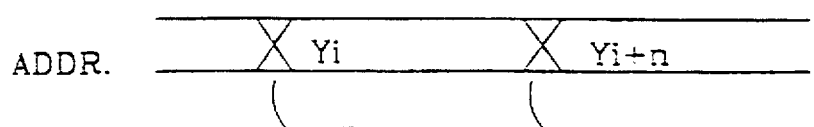
Figure 7:
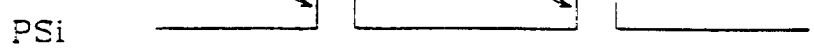

As shown in FIG. 7, a semiconductor memory device includes a plurality of bit line sense amplifiers (BLSAi, . . . ,BLSAn) 10-1, . . . ,10-n that amplifies data read from respective memory cells MC. A plurality of column switches 20-1, . . . ,20-n outputs data received from the bit line sense amplifiers (BLSAi, . . . ,BLSAn) 10-1, . . . ,10-n to input/output line set I/O, /I/O based on respective selection signals YSi, . . . ,YSn, and an I/O amplifier 40 amplifies the data output from the column switches 20-1, . . . ,20-n. A preferred embodiment of a column decoding circuit for the semiconductor memory device according to the present invention includes a plurality of pulse generating column decoders 80-1, . . . ,80-n for generating and outputting to the column switches 20-1, . . . ,20-n respective pulse signals PSi, . . . ,PSn based on column address signals selected from a plurality of sets of column address signals (Yi, . . . ,Yi +3), . . . ,(Yn, . . . ,Yn +3).

Figure 9:
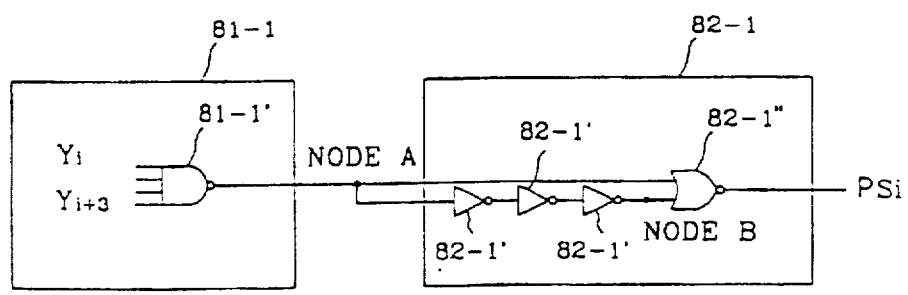
FIG. 9 is a diagram showing a circuit of a pulse generating column decoder of FIG. 7.
Figure 9:
Figure 9:
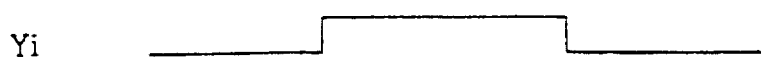
Figure 9:
Figure 9:
Figure 9:

The pulse generating column decoders 80-1, . . . ,80-n are identical in composition. As shown in FIG. 9, an exemplary pulse generating column decoder 80-1 includes a column decoding unit 81-1 having a NAND gate 81-1', and a pulse generator 82-1. The pulse generator 82-1 includes three inverters 82-1' serially coupled to each other to sequentially delay an output signal of the column decoding unit 81-1 and a NAND gate 82-1" for NANDing an output signal of the inverters 82-1' and the output signal of the column decoding unit 81-1.

Operations of the preferred embodiment of the column decoding circuit for the semiconductor memory device will now be described with reference to FIGS. 7 through 10E.

First, a word line W/Li is selected among a plurality of word lines W/Li, W/Li+i, . . . based on a row decoder (not shown). Then, data is read from a memory cell MC positioned on the word line W/Li, and the data is loaded on a corresponding set of bit lines B/Li,/B/Li. The data loaded on the bit line set B/Li,/B/Li is amplified to a predetermined level by the bit line sense amplifier (BLSAi) 10-1.

As shown in FIG. 8A, when a column address signal is selected from the column address signals Yi, . . . ,Yi+3 and applied to the pulse generating column decoder 80-1, the pulse generating column decoder 80-1 generates and outputs to the column switch 20-1 a pulse signal PSi shown in FIG. 8B. The pulse signal PSi has a predetermined pulse width.

Figure 8C:

As shown in FIG. 8C, the data amplified in the bit line sense amplifier (BLSAi) 10-1 is loaded through the column switch 20-1 on the input/output lines I/O, /I/O based on the pulse signal PSi.

That is, if a column address signal Yi is selected among the column address signals (Yi, . . . ,Yi +3) applied to the NAND gate 81-1' of the column decoding unit 81-1 as shown in FIG. 10B, a node A is turned to a different level as shown in FIG. 10C based on the output signal of the NAND gate 81- 1'. Accordingly, a column selecting signal at the node A is inverted through the serially connected three inverters 82-1' in the pulse generator 82-1, which turns a node B to a different level as shown in FIG. 10D.

The NAND gate 82-1" NANDs the respective signals from the nodes A, B. Thus, the pulse generator 82-1 outputs a high level pulse signal PSi having the predetermined pulse width as shown in FIG. 10E.

The transistors Q1, Q2 in the column switch 20-1 are turned on based on the high level pulse signal PSi. Thus, the data amplified in the bit line sense amplifier 10-1 are loaded on the input/output lines I/O, /I/O and amplified by the I/O amplifier 40 to perform a read operation of the data. When other column address signals (Yi+1, . . . , Yn) are selected, pulse generating column decoders 80-2, . . . , 80-n are respectively operated.

As described above, the preferred embodiment of the column decoding circuit for the semiconductor memory device generates a column selecting signal to select a column and uses a corresponding pulse generating unit to apply a pulse signal to a selected column switch. Thus, a high speed read operation can be performed by decreasing the loading and transmission time of the pulse signal. Further, the preferred embodiment of the column decoding circuit maintains a pulse width and logic swing width of the pulse signal received by the selected column switch regardless of the column location and a pulse generator is proximate to a column decoding unit. In addition, power consumption is reduced by generating the pulse signal at a column decoder unit. Accordingly, transmitting a signal through a single transmission line is not required to reduce the loading and transmission time of the pulse signal at a selected column switch.

It is to be understood that both the foregoing general description and the following detailed description are exemplary and explanatory. It will be apparent to those skilled in the art that various modifications can be made in the column decoding circuit and method of the present invention without departing from the spirit or scope of the invention. It is intended that the present invention cover the modifications and variations of this invention that are within the scope of the appended claims and their equivalents.

What is claimed is:

1. A column decoding circuit for a semiconductor memory device, comprising:

a plurality of memory cells arranged in a plurality of columns and rows, wherein data in a set of memory cells is read based on a selected row address signal;

a plurality of column switches coupled to respective ones of the plurality of columns, wherein the column switches receive the data read from the set of memory cells;

a decoding unit for decoding a selected column address and generating a selection signal to select one of the column switches; and a pulse generating unit proximate to the decoding unit that generates a pulse signal based on the selection signal and outputs the pulse signal to the selected column switch.

2. The circuit of claim 1, wherein the pulse signal has a minimum pulse width sufficient for selecting the corresponding column.

3. The circuit of claim 2, wherein a substantially identical pulse width and logic swing width are maintained regardless of a column location.

4. The circuit of claim 1, further comprising a plurality of pulse generating units and decoding units, wherein each of the plurality of pulse generating units is coupled to a corresponding one of the plurality of columns, and wherein said each of the plurality of pulse generating units is coupled to one of said plurality of decoding units.

5. The circuit of claim 1, wherein the pulse generating unit self-generates the pulse signal.

6. The circuit of claim 5, wherein the pulse generating unit further comprises:

a logic operation circuit; and a delay circuit, wherein the delay circuit generates a delay signal based on the selection signal, wherein the logic operation circuit receives the delay signal and the selection signal, and outputs the pulse signal.

7. The circuit of claim 1, wherein the pulse generator comprises:

a plurality of inverters to delay the selection signal; and a logic-gate for performing a logical operation on an output of the plurality of inverters and the selection signal.

8. The circuit of claim 7, wherein the plurality of inverters are coupled in series to sequentially delay the selection signal, and wherein the logic gate is a NAND-gate that NANDs the selection signal and the delayed selection signal.

9. The circuit of claim 1, further comprising a plurality of bit line sense amplifiers respectively coupled between the set of memory cells and the column switches.

10. The circuit of claim 1, wherein a substantially identical pulse width and logic swing width are maintained regardless of the column selected.

11. A column decoding circuit for use in a semiconductor memory device including a plurality of memory cells arranged in a plurality of columns and rows, and a plurality of column switches are coupled to respective ones of the plurality of columns to receive data read from a row of memory cells based on a row selecting signal, the column decoding circuit comprising:

a decoding unit for decoding a selected column address and generating a selection signal that selects one of the column switches; and a pulse generating unit proximate to the decoding unit that generates a pulse signal based on the selection signal and outputs the pulse signal to the selected column switch.

12. The circuit of claim 11, wherein the pulse signal has a minimum pulse width sufficient for selecting the corresponding column.

13. The circuit of claim 12, wherein a substantially identical pulse width and logic swing width are maintained regardless of the column switch selected.

14. The circuit of claim 11, further comprising a plurality of pulse generating units and decoding units, wherein each of the plurality of pulse generating units is coupled to a corresponding one of the plurality of column switches, and wherein said each of the plurality of pulse generating units is coupled to one of said plurality of decoding units.

15. The circuit of claim 11, wherein the pulse generating unit self-generates the pulse signal.

16. The circuit of claim 15, wherein the pulse generating unit further comprises:

a logic operation circuit; and a delay circuit, wherein the delay circuit generates a delay signal based on the selection signal, wherein the logic operation circuit outputs the pulse signal based on the delay signal and the selection signal.

17. The circuit of claim 16, wherein the delay circuit is a plurality of inverters coupled in series to sequentially delay the selection signal, and wherein the logic operation circuit is a NAND-gate that NANDs the selection signal and the delayed selection signal.

18. The circuit of claim 11, further comprising a plurality of bit line sense amplifiers respectively coupled between the row of memory cells and the column switches.

* * * * *